US011743634B2

(12) United States Patent
Boyd et al.

(10) Patent No.: US 11,743,634 B2
(45) Date of Patent: Aug. 29, 2023

(54) MEMS MICROPHONE

(71) Applicant: AAC ACOUSTIC TECHNOLOGIES (SHENZHEN) CO., LTD., Shenzhen (CN)

(72) Inventors: Euan James Boyd, Eb (GB); Anup Patel, Eb (GB); Colin Wei Hong Chung, Eb (GB)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 327 days.

(21) Appl. No.: 17/325,242

(22) Filed: May 20, 2021

(65) Prior Publication Data

US 2022/0377453 A1 Nov. 24, 2022

(51) Int. Cl.

*H04R 19/04* (2006.01)
*B81B 3/00* (2006.01)
*H04R 1/28* (2006.01)

(52) U.S. Cl.

CPC ............ *H04R 1/283* (2013.01); *H04R 19/04* (2013.01); *H04R 2201/003* (2013.01)

(58) Field of Classification Search

CPC . B81B 3/00; B81B 3/0021; B81B 2201/0257; B81B 2203/0127; B81B 2203/019; B81B 2203/0315; B81B 2203/0118; B81B 2203/01; H04R 19/01; H04R 19/04; H04R 19/005; H04R 23/02; H04R 2201/003; H04R 1/283

See application file for complete search history.

(56) References Cited

U.S. PATENT DOCUMENTS

| | | | | |
|---|---|---|---|---|
| 7,145,283 B2 * | 12/2006 | Takeuchi | H03H 9/059 | 310/348 |
| 7,635,941 B2 * | 12/2009 | Bank | H04R 7/18 | 310/348 |
| 8,582,788 B2 * | 11/2013 | Leidl | H04R 1/2838 | 381/174 |
| 10,555,088 B2 * | 2/2020 | Meisel | H04R 19/005 | |
| 11,267,695 B2 * | 3/2022 | Deas | B81B 7/0019 | |

(Continued)

FOREIGN PATENT DOCUMENTS

| | | |
|---|---|---|
| CN | 109005492 A * | 12/2018 |
| CN | 114697841 A * | 7/2022 |

(Continued)

*Primary Examiner* — Edgardo San Martin

(74) *Attorney, Agent, or Firm* — W&G Law Group

(57) ABSTRACT

An MEMS microphone includes a substrate including a back volume provided inside the substrate and an opening provided at an upper surface of the substrate to communicate the back volume; a sensing device provided at an inner side wall of the back volume; a first cantilever provided inside the back volume and including end portions coupling with the sensing device; a first membrane provided at the opening; a second membrane provided inside the back volume; and second cantilevers, each of which includes a first end mechanically supporting the first cantilever, and a second end connected to the second membrane. By suspending the first cantilever on the second cantilevers, the end portions of the first cantilever always couple with a preset position of the sensing device. Thus, the DC offset of the displacement of the membrane can be prevented.

10 Claims, 4 Drawing Sheets

(56) References Cited

U.S. PATENT DOCUMENTS

| | | | | |
|---|---|---|---|---|
| 11,303,993 | B2 * | 4/2022 | Rusconi Clerici Beltrami | H04R 31/00 |
| 2018/0186623 | A1 * | 7/2018 | Vossough | H01L 29/0669 |
| 2022/0256284 | A1 * | 8/2022 | Patel | H04R 3/02 |
| 2022/0332568 | A1 * | 10/2022 | Barsukou | B81B 3/0021 |
| 2022/0377453 | A1 * | 11/2022 | Boyd | H04R 1/283 |

FOREIGN PATENT DOCUMENTS

| | | | | |
|---|---|---|---|---|
| CN | 115243177 | A | * | 10/2022 |
| CN | 115580816 | A | * | 1/2023 |

* cited by examiner

MEMS MICROPHONE

TECHNICAL FIELD

The present disclosure relates to the field of acoustic-electric conversion and, in particular, to a micro-electro-mechanical system microphone.

BACKGROUND

At present, commercial micro-electro-mechanical system (MEMS) microphones have a back volume behind a membrane. The back volume is a semi-sealed air accommodation cavity, the air in which undergoes compression and expansion when a sound wave is input. The back volume can provide a space for vibration of the membrane. However, the accommodation cavity is the largest source of acoustic noise, which greatly limits an acoustic signal-to-noise ratio (SNR) in the microphones. The smaller a volume of the back volume, the larger the noise from the back volume. Therefore, it is impossible to achieve a microphone with an SNR higher than about 74 dB SNR unless the package dimensions are extremely large. If the back volume is a vacuum accommodation cavity and a sensing part of MEMS is replaced by one inside the vacuum accommodation cavity, not only can the noise from the back volume can be effectively eliminated, but also a damping noise related to movement of the membrane, such as back plate noise, can be eliminated. The only way to achieve high SNR in an ordinary or smaller package is to form a vacuum environment in the back volume.

However, there are two significant challenges with the microphone having such vacuum back volume. First, 1 atm pressure difference between air and vacuum will collapse a normal membrane. Therefore, a membrane with a high stiffness is needed, which will result in a low sensitivity. Second, when the ambient pressure changes significantly, displacement of the membrane may occur, and a direct current (DC) offset of the membrane will change. Thus, a traditional rotor-stator design of the sensing part will not work normally.

SUMMARY

In view of this, a MEMS microphone is provided according to embodiments of the present disclosure, aiming to solve the problems of displacement of end portions of the membrane and a change of a DC offset caused by a change of an ambient pressure.

A micro-electro-mechanical system (MEMS) microphone is provided according to an embodiment of the present. The MEMS microphone includes: a substrate including a back volume provided inside the substrate, and an opening provided at an upper surface of the substrate to communicate the back volume; a sensing device provided at an inner side wall of the back volume; a first cantilever provided inside the back volume and including end portions coupling with the sensing device; a first membrane provided at the opening, where the first membrane includes a first side that is connected to the first cantilever, and a second side opposite to the first side and configured to receive an external force; and a second membrane provided inside the back volume; second cantilevers, where each of the second cantilevers includes a first end mechanically supporting the first cantilever, and a second end connected to the second membrane.

In an improved embodiment, the MEMS microphone further includes a connecting rod, including an end connected to the first cantilever, and another end connected to a center of the first side of the first membrane.

In an improved embodiment, a flange is provided at an edge of the opening and extends towards the back volume, and edges of the first membrane abuts against the flange.

In an improved embodiment, the first membrane and the second membrane are located at two sides of the flange, respectively, and edges of the second membrane respectively abuts against an inner side wall of the back volume and the flange.

In an improved embodiment, the second membrane is spaced from the upper surface of the substrate, to form an auxiliary cavity between the upper surface of the substrate and the second membrane.

In an improved embodiment, a plurality of pressure relief holes are provided at the upper surface of the substrate opposite to the second membrane, to communicate the auxiliary cavity with atmosphere.

In an improved embodiment, each of the second cantilevers includes a first connection rod and a second connection rod, where the first connection rod includes a first rod connecting end connected to the second connection rod, and the second end connected to a center of the second membrane; and the second connection rod includes a second rod connecting end connected to the first rode connecting end of the first connection rod, and the first end hinged to the first cantilever.

In an improved embodiment, the first cantilever includes a hinge provided to connect to the first end of the second connection rod, wherein the first end of the second connection rod is connected to a stator part of the hinge.

In an improved embodiment, the first membrane, the second membrane and the second cantilevers are all located a same side of the first cantilever.

In an improved embodiment, the inner side wall of the back volume is provided with a position limiting protrusion, and the edges of the second membrane respectively abuts against the position limiting protrusion and the flange.

It should be understood that the foregoing general description and the following detailed description are merely exemplary and illustrative and shall not be illustrated as a limitation on the present disclosure.

MAIM REFERENCE NUMERALS OF ELEMENTS

Figure 1:
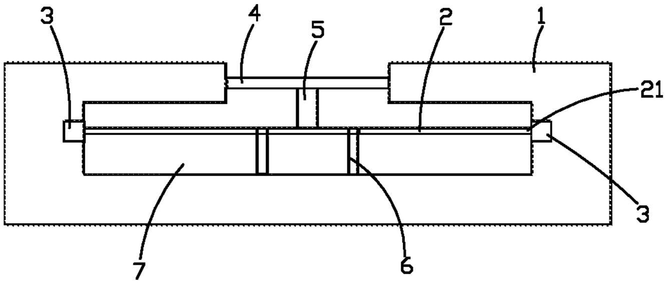
FIG. 1 is a state diagram of a conventional microphone when no external force is applied.

1: substrate;
2: cantilever;
21: end portion;
3: sensing device;
4: membrane;
5: connection body;
6: support arm;
7: inner cavity;
100: substrate;
110: opening;

120: flange;
130: pressure relief hole;
140: back volume;
150: position limiting protrusion;
200: sensing device;
300: first cantilever;
310: end portion;
400: first membrane;
500: second cantilever;
510: first connection rod;
520: second connection rod;
600: second membrane; and
700: connecting rod.

The drawings herein are incorporated into and constitute a part of the present specification, illustrate embodiments of the present disclosure and explain principles of the present disclosure together with the specification.

DESCRIPTION OF EMBODIMENTS

In order to better illustrate a purpose, technical schemes, and advantages of the present disclosure, the present disclosure is described in detail as follows with reference to the accompanying drawings and embodiments. It should be understood that these embodiments described herein are merely used to explain the present disclosure, but not to limit the present disclosure.

In the description of the present disclosure, unless expressly stipulated and limited, otherwise, the terms "first" and "second" are merely used for descriptive purposes and shall be illustrated as indicating or implying relative importance; unless expressly stipulated and limited, otherwise, the terms "a plurality of" and "multiple" refers to two or more, and the terms "connection" and "fixation" shall be illustrated as a broad sense, for example, "connection" may refer to "fixed connection", "detachable connection", "integral connection", or "electrical connection", and the "connection" may be "direct connection" or "indirect connection through an intermediate medium". For those skilled in the art, the specific meanings of these terms in the present disclosure can be understood according to specific circumstances.

It should be understood that in the description of the present disclosure, the terms such as "above", "under" and the like are used to indicate positions shown in the drawing, instead of being construed as limitations of the embodiment of the present disclosure. In addition, when an element is described as being "above" or "under" another element in the context, it should be understood that the element can be directly or via an intermediate element located "above" or "under" another element.

Figure 2:
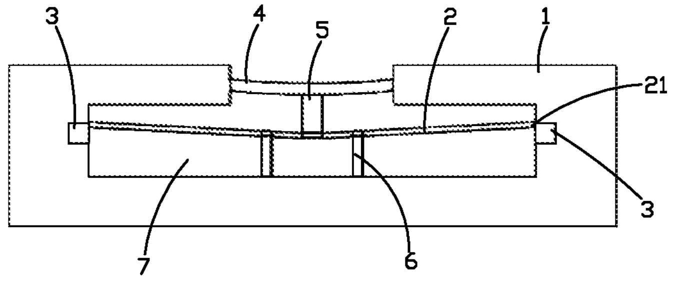
FIG. 2 is a state diagram of a conventional microphone under an external force.

As shown in FIG. 1 and FIG. 2, a conventional microphone includes a substrate 1, a cantilever 2, support arms 6, a membrane 4, a plunger 5 and a sensing device 3. An inner cavity 7 is provided in the substrate 1, and the sensing device 3 and the cantilever 2 are arranged in the inner cavity 7. End portions 21 of the cantilever 2 couple with the sensing device 3. Each support arm 6 includes an end fixedly connected to a bottom of the inner cavity 7, and another end hinged to the cantilever 2. The membrane 4 is connected to a center of the cantilever 2 through the plunger 5. The membrane 4 is arranged at a side of the cantilever 2, and the support arms 6 are arranged at another side of the cantilever 2.

When the membrane 4 is not subjected to a force, as shown in FIG. 1, the membrane 4 is in a flat state, and the cantilever 2 is straight and couples to a middle position of the sensing device 3.

When the membrane 4 is subjected to an external force, as shown in FIG. 2, the membrane 4 is recessed in a direction towards the inner cavity 7. The plunger 5 moves down, and the portion of the cantilever 2 connected to the connection body 5 is recessed in a direction away from the membrane 4. The cantilever 2 is supported by the support arms 6, to form a lever structure with the support arms 6. In this case, when the center of the cantilever 2 is subjected to a downward force through the plunger 5, end portions 21, couples to the sensing device 3, of the support arm 2 will tilt up, causing the end portions 21 of the cantilever 2 to have a upward displacement relative to the sensing device 3 and deviate from a middle position of the sensing device 3. As shown in FIG. 2, slight deformation of the center of the cantilever 2 will cause the end portions 21 of the cantilever 2 to have a large displacement. Therefore, the conventional microphone cannot deal with a change of an ambient pressure. When the ambient pressure changes, a change of the membrane within a range of 3 μm may significantly result in an excessive change of a DC offset of the end portion 21 of the cantilever 2, making the sensing device 3 not able to work normally.

Figure 3:
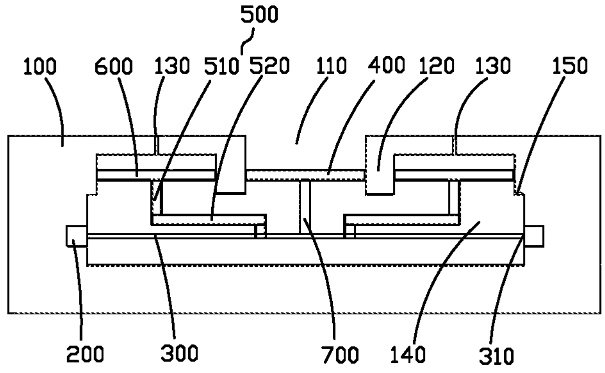
FIG. 3 is a state diagram I of an MEMS microphone according to an embodiment of the present disclosure.
Figure 4:
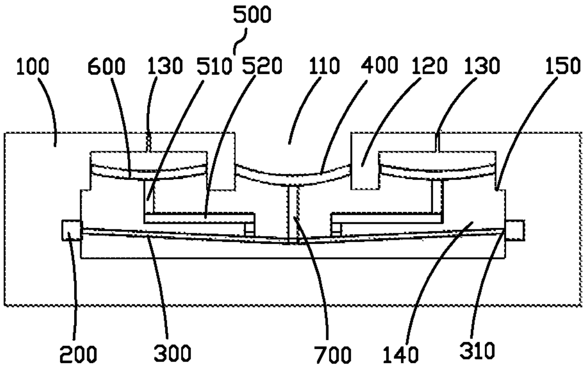
FIG. 4 is a state diagram II of an MEMS microphone according to an embodiment of the present disclosure.

In an embodiment of the present disclosure, a micro-electro-mechanical system (MEMS) microphone is provided. As shown in FIGS. 3 and 4, in this embodiment, the MEMS microphone includes a substrate 100, a sensing device 200, a first cantilever 300, a first membrane 400, a second cantilever 500 and a second membrane 600. Herein, a back volume 140 is provided in the substrate 100. An opening 110 is provided at an upper surface of the substrate and communicates with the back volume 140. The sensing device 200 is provided at an inner side wall of the back volume 140. The first cantilever 300 is arranged inside the back volume 140, which includes end portions 310 coupling with the sensing device. The first membrane 400 is provided at the opening 110, and a side of the first membrane 400 is connected to the first cantilever 300, and another side of the first membrane 400 is used to receive an external force. The second membrane is provided inside the back volume 140. Each of the second cantilevers 500 includes a first end mechanically supporting the first cantilever 300, and a second end connected to a side of the second membrane 600.

In an embodiment, the MEMS microphone is a vacuum microphone with a back volume.

In an embodiment, the sensing device 200 may be a comb sensing device including multiple first comb fingers. Multiple second comb fingers are provided at the end portions 310 of the first cantilever 300. The first comb fingers and the second comb fingers are interdigitated to operate as a comb sensing device.

When no external force is applied, the first membrane 400 and the second membrane 600 are in a flat state, and the first cantilever 300 is straight, as shown in FIG. 3.

FIG. 4 shows a state diagram of an MEMS microphone according to an embodiment of the present disclosure. As shown in FIG. 4, when an external pressure force is applied on the first membrane 400 via the opening 110, the first membrane 400 is recessed in a direction towards the back volume 140. In an embodiment, the external pressure force is a DC ambient pressure, a full range of which is 0.5 atm to 1 atm. Due to a connection between the first cantilever 300 and the first membrane 400, the first cantilever 300 is recessed downwards with the recession of the first membrane 400. By suspending the first cantilever 300 on the second cantilevers 500, the first cantilever 300 indirectly hinges on the second membrane 600. Thus, the second membrane 600 is recessed downwards together with the first cantilever 300. Therefore, when the first membrane 400 is subjected to the DC ambient pressure, the end portions 310 of the first cantilever 300 always couple with a preset position of the sensing device 200 without any displacement, as shown in FIG. 3 and FIG. 4. Thus, the DC offset of the displacement of the membrane can be prevented.

In an embodiment, the first membrane 400, the second membrane 600 and the second cantilever 500 are located at a same side of the first cantilever 300. When the first cantilever 300 is recessed downwards, the end portions 310 of the first cantilever 300 will not have a large DC displacement relative to the comb sensing device 200 under the level principle.

In an embodiment of the present disclosure, the second membrane 600 is spaced from the upper surface of the substrate 100, to form an auxiliary cavity between the upper surface of the substrate 100 and the second membrane 600. Multiple pressure relief holes 130 are provided at the upper surface of the substrate 100, to communicate the auxiliary cavity with atmosphere. The pressure relief holes 130 are opposite to the second membrane 600.

In an embodiment, the substrate 100 is provided with pressure relief holes 130 around the opening 110. As shown in FIG. 4, when both the first membrane 400 and the second membrane 600 are exposed to the DC ambient pressure, the second membrane 600 is recessed downwards after receiving the pressure from the pressure relief holes 130. In this way, through a combined action of the pressure relief holes 130, the second membrane 600 and the chamber, a function of an acoustic low-pass filter can be achieved. In addition, an alternating current (AC) pressure is allowed to be converted to an AC displacement of the end portions 310 of the cantilever 300 and prevent a DC pressure from being transmitted to the end portions 310 of the first cantilever 300 to cause a DC displacement. By tuning the compliance of the second membrane 600, zero DC displacement of the end portions 310 of the first cantilever 300 can be achieved. In an embodiment, the diameter of the second membrane 600 can be adjusted to achieve the zero DC displacement of the end portions 310.

In an implementation manner, the MEMS microphone further includes a connecting rod 700, including an end connected to the first cantilever 300, and another end connected to a center of the first membrane 400. When the first membrane 400 is recessed in a direction towards the back volume 140, the first cantilever 300 can be simultaneously recessed downwards under an action of the connecting rod 700, as shown in FIG. 4.

In an implementation manner, a flange 120 is provided at an edge of the opening 110, and the flange 120 extends towards the back volume 140. The edges of the first membrane 400 abuts against the flange 120. Therefore, a position of the first membrane 400 can be limited by the flange 120, thereby preventing the first membrane 400 from deviating in the radial direction.

In an implementation manner, the first membrane 400 and the second membrane 600 are located at two sides of the flange 120, respectively. Edges of the second membrane 600 respectively abut against an inner side wall of the back volume 140 and the flange 120. The auxiliary cavity is formed by the inner side wall of the back volume 140, the flange 120, the substrate 100 and the second membrane 600, so as to achieve a function of an acoustic low-pass filter.

In an implementation manner, the second cantilever 500 includes a first connection rod 510 and a second connection rod 520. The first connection rod 510 includes a first rod connecting end connected to the second connection rod 520, and the second end connected to the center of the second membrane 600. The second connection rod 520 includes a second rod connecting end connected to the first rod connecting end of the first connection rod 510 and the first end hinged to the first cantilever 300.

The second cantilever 500 has the purpose of connecting the anchors of the hinges to the second membrane 600. Thus, in order to hinge the second connection rod 520 to the first cantilever 300, the first cantilever 300 includes a hinge connected to the first end of the second connection rod 520. The first end of the second connection rod 520 is connected to a stator part of the hinge.

In an embodiment, the second connection rod 520 is connected to the stator part of the hinge of the first cantilever 300 at a position adjacent to the connecting rod 700, and the first connection rod 510 is vertically connected to the second connection rod 520. Thus, the first connection rod 510 and the second membrane 600 can be displaced at a position opposite to the pressure relief holes 130 by means of the second connection rod 520.

In an implementation manner, a position limiting protrusion 150 is formed on the inner wall of the back volume 140. The position limiting protrusion 150 may provide the first cantilever 300 at a position above the first cantilever 300, so as to limit a position of the first cantilever 300, thereby ensuring that the first cantilever 300 works normally in the back volume 140.

The above-described embodiments are merely preferred embodiments of the present disclosure and are not intended to limit the present disclosure. Various changes and modifications can be made to the present disclosure by those skilled in the art. Any modifications, equivalent substitutions and improvements made within the principle of the present disclosure shall fall into the protection scope of the present disclosure.

What is claimed is:

1. A micro-electro-mechanical system (MEMS) microphone, comprising:
- a substrate comprising a back volume provided inside the substrate and an opening provided at an upper surface of the substrate to communicate the back volume;
- a sensing device provided at an inner side wall of the back volume;
- a first cantilever provided inside the back volume and comprising end portions coupling with the sensing device;
- a first membrane provided at the opening, wherein the first membrane comprises a first side connected to the first cantilever, and a second side opposite to the first side and configured to receive an external force;
- a second membrane provided inside the back volume; and
- second cantilevers, wherein each of the second cantilevers comprises a first end mechanically supporting the first cantilever, and a second end connected to the second membrane.

2. The MEMS microphone as described in claim 1, further comprising a connecting rod, comprising an end connected to the first cantilever, and another end connected to a center of the first side of the first membrane.

3. The MEMS microphone as described in claim 1, wherein a flange is provided at an edge of the opening and extends towards the back volume, and an edge of the first membrane abuts against the flange.

4. The MEMS microphone as described in claim 3, wherein the first membrane and the second membrane are located at two sides of the flange respectively, and edges of the second membrane respectively abuts against the inner side wall of the back volume and the flange.

5. The MEMS microphone as described in claim 4, wherein the inner side wall of the back volume is provided with a position limiting protrusion, and the edges of the second membrane respectively abuts against the position limiting protrusion and the flange.

6. The MEMS microphone as described in claim 1, the second membrane is spaced from the upper surface of the substrate, to form an auxiliary cavity between the upper surface of the substrate and the second membrane.

7. The MEMS microphone as described in claim 6, wherein a plurality of pressure relief holes are provided at the upper surface of the substrate and are opposite to the second membrane, to communicate the auxiliary cavity with atmosphere.

8. The MEMS microphone as described in claim 1, wherein each of the second cantilevers comprises a first connection rod and a second connection rod, wherein the first connection rod comprises a first rod connecting end connected to the second connection rod, and the second end connected to a center of the second membrane; and the second connection rod comprises a second rod connecting end connected to the first rode connecting end of the first connection rod, and the first end hinged to the first cantilever.

9. The MEMS microphone as described in claim 8, wherein the first cantilever comprises a hinge connected to the first end of the second connection rod, wherein the first end of the second connection rod is connected to a stator part of the hinge.

10. The MEMS microphone as described in claim 1, wherein the first membrane, the second membrane and the second cantilevers are all located a same side of the first cantilever.

* * * * *